(12) United States Patent
Xu (10) Patent No.: US 10,656,221 B2
(45) Date of Patent: May 19, 2020

(54) DRIVE CIRCUIT OF RADIO-FREQUENCY TRANSMITTING COIL AND MAGNETIC RESONANCE IMAGING DEVICE

(71) Applicant: Shanghai Neusoft Medical Technology Co., Ltd., Shanghai (CN)

(72) Inventor: Qin Xu, Shanghai (CN)

(73) Assignee: Shanghai Neusoft Medical Technology Co., Ltd., Shanghai (CN)

( * ) Notice: Subject to any disclaimer, the term of this patent is extended or adjusted under 35 U.S.C. 154(b) by 42 days.

(21) Appl. No.: 15/875,633

(22) Filed: Jan. 19, 2018

(65) Prior Publication Data

US 2018/0210046 A1 Jul. 26, 2018

(30) Foreign Application Priority Data

Jan. 22, 2017 (CN) .......................... 2017 1 0047813

(51) Int. Cl.
| | | |
|---|---|---|
| G01R 33/36 | (2006.01) | |
| H01Q 3/38 | (2006.01) | |
| H01Q 1/36 | (2006.01) | |
| H01Q 7/00 | (2006.01) | |
| H01Q 3/40 | (2006.01) | |
| H01Q 5/35 | (2015.01) | |
| H01Q 25/02 | (2006.01) | |
| H01Q 5/307 | (2015.01) | |
| G01R 33/34 | (2006.01) | |
| G01R 33/565 | (2006.01) | |

(52) U.S. Cl.
CPC ... *G01R 33/3614* (2013.01); *G01R 33/34076* (2013.01); *G01R 33/3607* (2013.01); *G01R 33/3628* (2013.01); *H01Q 1/36* (2013.01); *H01Q 3/38* (2013.01); *H01Q 3/40* (2013.01); *H01Q 5/307* (2015.01); *H01Q 5/35* (2015.01); *H01Q 7/00* (2013.01); *H01Q 25/02* (2013.01); *G01R 33/5659* (2013.01)

(58) Field of Classification Search
None
See application file for complete search history.

(56) References Cited

U.S. PATENT DOCUMENTS

| | | | |
|---|---|---|---|
| 2014/0125339 A1* | 5/2014 | Lee .................... | G01R 33/3415 324/319 |
| 2018/0203083 A1* | 7/2018 | Sohn .................. | G01R 33/3607 |
| 2018/0238978 A1* | 8/2018 | McNulty ............ | G01R 33/3802 |

FOREIGN PATENT DOCUMENTS

| | | |
|---|---|---|
| CN | 101872001 A | 10/2010 |
| CN | 102810745 A | 12/2012 |

(Continued)

OTHER PUBLICATIONS

Machine English Translation of CN 101872001 to Zhentao dated Oct. 27, 2010 (Year: 2010).*

(Continued)

*Primary Examiner* — Douglas X Rodriguez
(74) *Attorney, Agent, or Firm* — Fish & Richardson P.C.

(57) ABSTRACT

A drive circuit of a radio-frequency (RF) transmitting coil and a magnetic resonance imaging (MRI) device are provided. According to an example, the drive circuit includes a controller, a digital-to-analogue converter (DAC) coupled with the controller, a RF amplifier coupled with the DAC, a power divider coupled with the RF amplifier, and a plurality of phase shifters respectively coupled with at least three output ports of the power divider.

20 Claims, 4 Drawing Sheets

(56) References Cited

FOREIGN PATENT DOCUMENTS

| | | |
|---|---|---|
| CN | 103414001 A | 11/2013 |
| CN | 103698725 A | 4/2014 |
| CN | 104515963 A | 4/2015 |
| CN | 105203976 A | 12/2015 |

OTHER PUBLICATIONS

Machine English Translation of CN 105203976 to Dou dated Dec. 30, 2015 (Year: 2015).*
CN102810745 (Zheng) Machine English Translation (Year: 2012).*
State Intellectual Property Office of the People's Republic of China, Office Action and Search Report mailed in Chinese Application No. 201710047813X (dated Nov. 30, 2018) 14 pages, (Submitted with Partial Translation).
State Intellectual Property Office of the People's Republic of China, Notification of Rejection of Decision Issued in Application No. 201710047813.X, dated Oct. 8, 2019, 13 pages,(Submitted with Partial English-language Translation).
Military Science Press, "Encyclopedia of Chinese military", Military Technique I, Jul. 1997, Beijing, 5 pages.

* cited by examiner

DRIVE CIRCUIT OF RADIO-FREQUENCY TRANSMITTING COIL AND MAGNETIC RESONANCE IMAGING DEVICE

CROSS REFERENCE TO RELATED APPLICATIONS

This application claims priority to Chinese Patent Application No. 201710047813.X, entitled "DRIVE CIRCUIT OF RADIO-FREQUENCY TRANSMITTING COIL AND MAGNETIC RESONANCE IMAGING DEVICE", filed on Jan. 22, 2017, the entire content of which is incorporated herein by reference.

TECHNICAL FIELD

The present disclosure relates to a drive circuit of a radio-frequency (RF) transmitting coil and a magnetic resonance imaging (MRI) device.

BACKGROUND

A RF transmitting coil is one of important parts of a magnetic resonance imaging (MRI) system, and the MRI system may perform MRI scanning by exciting hydrogen protons in a human body with the RF transmitting coil. The RF transmitting coil may be used to transmit a RF pulse. Moreover, how to generate a uniform RF field, such as, a B1 field, is important in a process of the MRI scanning.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides a drive circuit of a radio-frequency (RF) transmitting coil and a magnetic resonance imaging (MRI) device including the drive circuit and the RF transmitting coil.

One aspect of the present disclosure features a drive circuit of a radio-frequency (RF) transmitting coil, including: a controller configured to output a drive signal; a digital to analogue converter (DAC) coupled with the controller and configured to perform D/A conversion for the drive signal to output an analogue drive signal; a RF amplifier coupled with the DAC and configured to amplify the analogue drive signal to obtain an amplified analogue drive signal; a power divider coupled with the RF amplifier and configured to generate at least three signals based on the amplified analogue drive signal, wherein the power divider has at least three output ports each configured to output a respective signal of the at least three signals; and a plurality of phase shifters coupled with the power divider, each of the phase shifters being coupled with a respective output port of the at least three output ports and configured to adjust a phase of the respective signal output by the respective output port to obtain a phase adjusted signal, where the phase shifters are configured to output the phase adjusted signals to respective feed ports of the RF transmitting coil.

The RF transmitting coil can include a cage RF transmitting coil, and the respective feed ports coupled with the phase shifters can be arranged along a circumferential direction of the RF transmitting coil in an equal internal. A number of the output ports of the power divider and a number of the phase shifters can both be equal to a number of the feed ports of the RF transmitting coil.

In some implementations, the power divider includes a plurality of waveguides configured to generate the at least three signals from the amplified analogue drive signal, and the at least three signals can have an equal power. In some examples, the power divider includes: four first waveguides in a central symmetry, wherein each of the first waveguides has an inlet end serving as an input port of the power divider and two outlet ends; and eight second waveguides, wherein each of the second waveguides is respectively coupled with one of the two outlet ends of one of the first waveguides, and wherein two of the second waveguides coupled with the two outlet ends of the same first waveguide are symmetric and each of the second waveguides has two outlet ends serving as the output ports of the power divider.

In some cases, each of the first waveguides can include: a first connecting part of which an inlet end serves as the input port of the power divider; and a second connecting part of which a central position is vertically coupled to an outlet end of the first connecting part and two outlet ends are both vertically coupled to a central position of the corresponding second waveguide, where the first connecting part is in communication with the second connecting part. In some cases, two output ports of the power divider on each of the second waveguides can be arranged symmetrically with respect to a central position of the corresponding second waveguide.

Each of the phase shifters can include a variable capacitance diode coupled with a controllable voltage source. The controllable voltage source can be coupled with the controller, and a voltage of the controllable voltage source can be controllable by the controller. The driver circuit can further include a RF field detector. The RF field detector can be configured to detect RF field intensities on a plurality of positions of the RF transmitting coil and send the RF field intensities to the controller, and the controller can be configured to adjust the voltage of the controllable voltage source based on the RF field intensities on the plurality of positions.

Another aspect of the present disclosure features a magnetic resonance imaging (MRI) device including: a RF transmitting coil and a drive circuit for the RF transmitting coil. The drive circuit can be the drive circuit as described above.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

A RF transmitting coil of an MRI system can be a cage coil, a solenoid coil, a saddle coil, a Helmholtz coil, or a transverse electro-magnetic coil. Among them, the cage RF transmitting coil is relatively widely applied in the MRI system. The cage RF transmitting coil can have a number of characteristics: a RF field generated by the cage RF transmitting coil has a relatively high uniformity; the cage RF transmitting coil is coaxial with a main magnetic field $B_0$; the cage RF transmitting coil is symmetric and a signal-to-noise ratio can be increased by $\sqrt{2}$ times.

Figure 1:
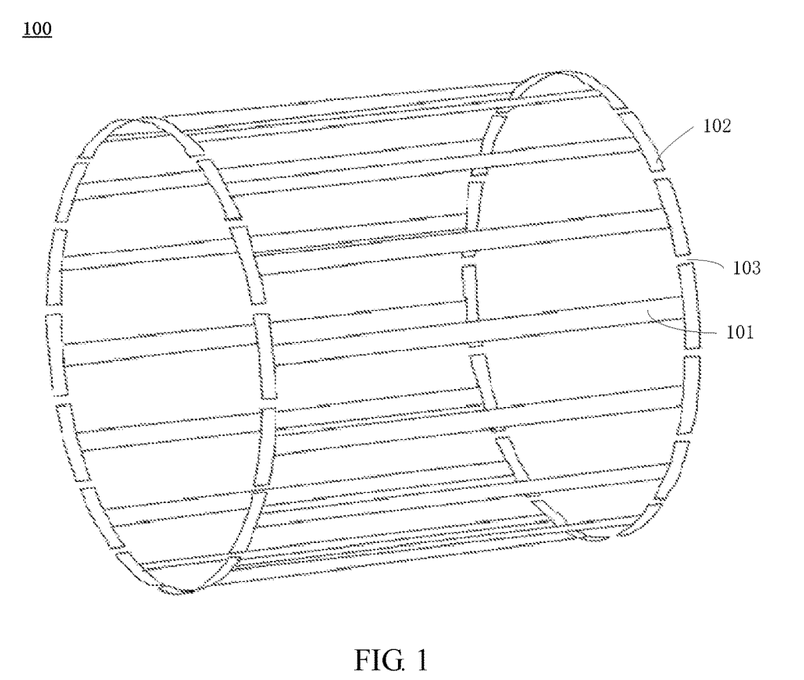
FIG. 1 is a schematic diagram illustrating a structure of a cage RF transmitting coil according to an example of the present disclosure.

FIG. 1 is a schematic diagram illustrating a structure of a cage RF transmitting coil 100. The cage RF transmitting coil 100 may include a plurality of coil legs 101 in a circumferential distribution and a plurality of connecting parts 102 for connecting the coil legs 101. A plurality of feed ports 103 (for example, a gap between the connecting parts 102 corresponding to two coil legs 101) are arranged at two ends of the cage RF transmitting coil 100 respectively. For illustration only, in FIG. 1, 16 feed ports 103 are shown.

In some cases, the performance of the RF magnetic field generated by the cage RF transmitting coil 100 may be restricted by the number of coil legs 101. When the number of the coil legs 101 is reduced, the uniformity of the RF field may be lowered. When a length and a diameter of the cage RF transmitting coil 100 and a width of the coil legs 101 are kept unchanged, if the number of the coil legs 101 is reduced, the uniformity of the RF field also becomes lower. While, when the number of the coil legs 101 keeps increasing, the uniformity of the RF field may not be improved greatly.

Figure 2:
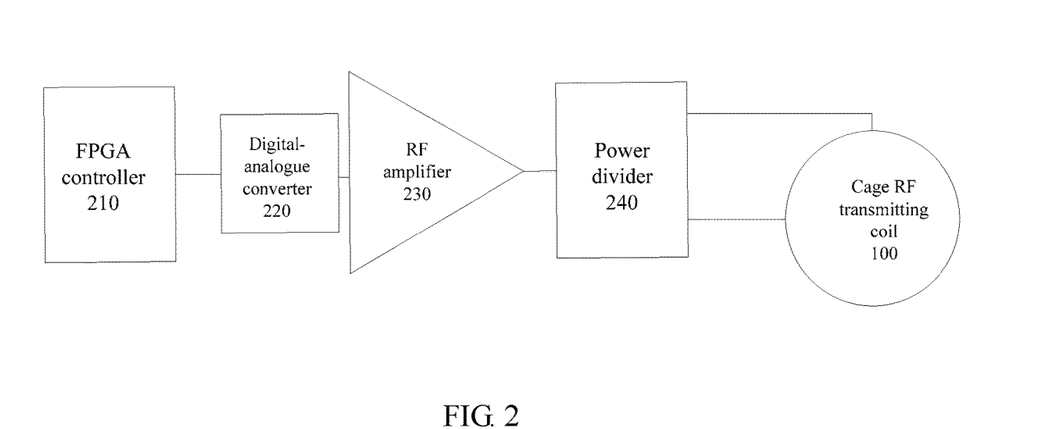
FIG. 2 is a schematic diagram illustrating a structure of a drive circuit of a RF transmitting coil according to an example of the present disclosure.

FIG. 2 is a schematic diagram illustrating a drive circuit of a RF transmitting coil according to an example of the present disclosure. The drive circuit may include a Field-Programmable Gate Array (FPGA) controller 210 configured to output a drive signal, a digital to analogue converter (DAC) 220 coupled with the FPGA controller 210 and configured to perform D/A conversion for the drive signal so as to output an analogue drive signal, a RF amplifier 230 coupled with the DAC 220 and configured to amplify the analogue drive signal to obtain an amplified analogue drive signal, and a power divider 240 coupled with the RF amplifier 230. In combination with FIG. 1, the power divider 240 may be configured to generate two orthogonal signals (such as, inphase and quadrature (IQ) signal(s)) from the amplified analogue drive signal. For example, the power divider 240 is configured to generate two signals with a phase difference of 90 degrees from the amplified analogue drive signal. The power divider 240 may be further configured to transmit the two signals with the phase difference of 90 degrees to two feed ports 103 of the cage RF transmitting coil 100 as shown in FIG. 1. An angle between the two feed ports 103 is 90 degrees so that the cage RF transmitting coil 100 is driven to generate a circularly polarized field. Energy amplitudes and waveforms of the two signals output by the power divider 240 can be the same. The power divider 240 may be simply configured to generate the two signals from the amplified analogue drive signal output by the RF amplifier 230, without changing the characteristics of the two signals from the amplified analogue drive signal. For example, the characteristics of the two signals output by the power divider 240 are fixed and cannot be adjusted as desired. In some cases, a RF field applied to each subject may be different and thus the characteristics, such as, frequency, energy, waveform, phase, and the like, of the signal which is input to each of feed ports 103 of the cage RF transmitting coil 100 may need to be adjusted, so as to implement a uniformity of the RF field.

Figure 3:
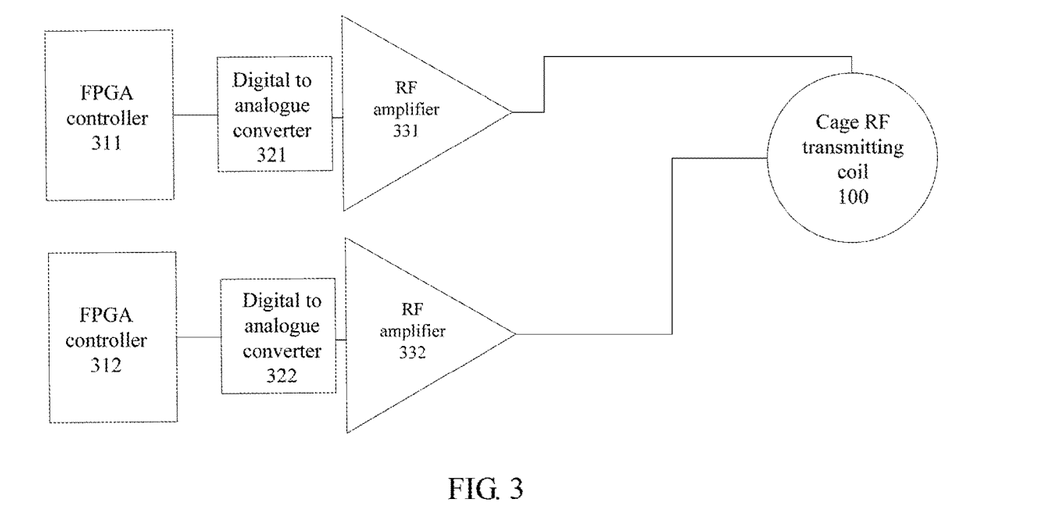
FIG. 3 is a schematic diagram illustrating a structure of a drive circuit of a RF transmitting coil according to another example of the present disclosure.

FIG. 3 is a schematic diagram illustrating a drive circuit of a RF transmitting coil according to another example of the present disclosure. The drive circuit may include two FPGA controllers 311, 312, two DACs 321, 322 and two RF amplifiers 331, 332 which are coupled in sequence. The FPGA controller 311 may be configured to output a first drive signal to the DAC 321. The DAC 321 may be configured to convert the first drive signal to a first analogue drive signal and transmit the first analogue drive signal to the RF amplifier 331. The RF amplifier 331 may be configured to amplify the first analogue drive signal to obtain an amplified first analogue drive signal and then output the amplified first analogue drive signal to a first feed port of the cage RF transmitting coil 100. The FPGA controller 312 may be configured to output a second drive signal to the DAC 322. The DAC 322 may be configured to convert the second drive signal to a second analogue drive signal and transmit the second analogue drive signal to the RF amplifier 332. The RF amplifier 332 may be configured to amplify the second analogue drive signal to obtain an amplified second analogue drive signal and then output the amplified second analogue drive signal to a second feed port of the cage RF transmitting coil 100. In FIG. 3, a first link may include the FPGA controllers 311, the DAC 321, the RF amplifier 331 and the first feed port. A second link may include the FPGA controllers 312, the DAC 322, the RF amplifier 332 and the second feed port. In this circuit as shown in FIG. 3, a drive signal input to a link at which a feed port 103 is located may be adjusted through an FPGA controller included in the link. In this way, characteristics of a signal input to the feed port 103 may be changed along with the change of the drive signal. Although the drive circuit as shown in FIG. 3 may adjust the characteristics of the signal input to each feed port 103 according to the subject, the uniformity of the RF field may be still relatively low as there are only two feed ports. Moreover, the cost of the RF amplifier is relatively high, and thus two RF amplifiers may lead to a sharp increase of the cost.

Figure 4:
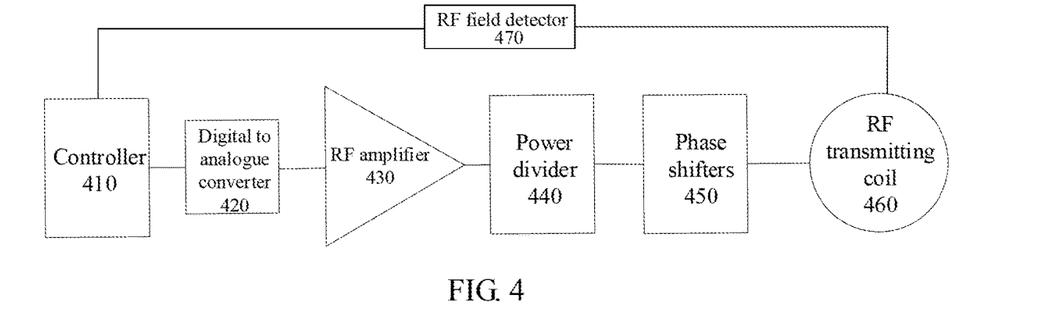
FIG. 4 is a schematic diagram illustrating a structure of a drive circuit of a RF transmitting coil according to still another example of the present disclosure.

FIG. 4 is a diagram illustrating a drive circuit of a RF transmitting coil 460 according to another example of the present disclosure. The drive circuit may include a controller 410, a DAC 420, a RF amplifier 430, a power divider 440 and a plurality of phase shifters 450, where the controller 410 is configured to output a drive signal; the DAC 420 is coupled with the controller 410 and configured to perform D/A conversion for the drive signal to output an analogue drive signal; the RF amplifier 430 is coupled with the DAC 420 to amplify the analogue drive signal to obtain an amplified analogue drive signal; the power divider 440 is coupled with the RF amplifier 430, provided with at least three output ports, and configured to generate at least three signals from the amplified analogue drive signal; where, the at least three signals are to be output respectively from a corresponding one of the at least three output ports; and each of the phase shifters 450 is coupled with one of the at least three output ports of the power divider 440. A phase of the signal output by each of the at least three output ports of the power divider 440 may be adjusted by a corresponding one of the phase shifters 450 to obtain a phase adjusted signal, and the phase adjusted signals output from the phase shifters may be respectively sent to a corresponding one of feed ports of the RF transmitting coil 460.

The characteristics of a signal input to each feed port of the RF transmitting coil 460 may be dynamically adjusted by the power divider 440 and the phase shifter 450 in the drive circuit of the RF transmitting coil 460. In this way, the uniformity of a RF field generated by the RF transmitting coil 460 may be controlled. Meanwhile, the drive circuit of the RF transmitting coil 460 only requires one RF amplifier 430, and thus the cost can be relatively lower.

Here, the controller 410 may include a controller which is selected from a group of controllers including FPGA, Advanced RISC Machines (ARM), Reduced Instruction Set Computer (RISC), Complex Programmable Logic Device (CPLD), Digital Signal Processing (DSP), and so on.

The controller 410 may also be electrically coupled with an upper machine like a computer to receive a drive signal transmitted by the upper machine.

The power divider 440 may be configured to generate N signals from the amplified analogue drive signal so as to adapt a number of different RF links in a practical application. In an example, the power divider 440 may include a 1/N power divider (N is a natural number, and N≥3), for example, a ¼ power divider, a ⅛ power divider, a 1/16 power divider, etc.

To ensure that the signals input to all feed ports of the RF transmitting coil 460 are equal in power and amplitude and the uniformity of the RF field, the power divider 440 may be configured to generate N signals from the amplified analogue drive signal, and the N signals have equal power.

In addition, the type of the power divider 440 may be selected as desired, such as, a Wilkinson power divider.

In an example, the RF transmitting coil 460 may include the cage RF transmitting coil 100 shown in FIG. 1.

In an example, the number N of output ports of the power divider 460 may be an even number, which is greater than or equal to 4.

Taking as an example, the number of feed ports 103 of the cage RF transmitting coil 100 shown in FIG. 1 is 16, the drive circuit of the RF transmitting coil provided by the present disclosure will be described below in detail. In an example, 8 signals may be respectively input to the even-number-th feed ports of the 16 feed ports. In this way, the 8 signals are relatively symmetrically applied to the cage RF transmitting coil 100 and then the uniformity of the magnetic field generated by the cage RF transmitting coil 100 is improved.

Here, the feed ports 103 coupled with the respective phase shifters may be arranged along a circumferential direction of the cage RF transmitting coil 100 in an equal internal, and thus each coil leg 101 of the cage RF transmitting coil 100 may bear a relatively uniform signal, thereby generating a uniform RF field.

To make a RF field generated by the cage RF transmitting coil 100 more uniform and facilitate adjusting characteristics of the signal input to each of the feed ports 103 based on feedback of a RF field detector 470, as shown in FIG. 4, a number of the output ports of the power divider 440 and a number of the phase shifters 450 may be both equal to a number of the feed ports 103 of the RF transmitting coil 100. The characteristics of the signal input to each of the feed ports 103 can be controlled, such that the cage RF transmitting coil 100 can generate a relatively uniform RF field. When the cage RF transmitting coil 100 is driven to generate a RF field, it is only required that the feed ports 103 at the same end of the cage RF transmitting coil 100 access signals.

Figure 5:
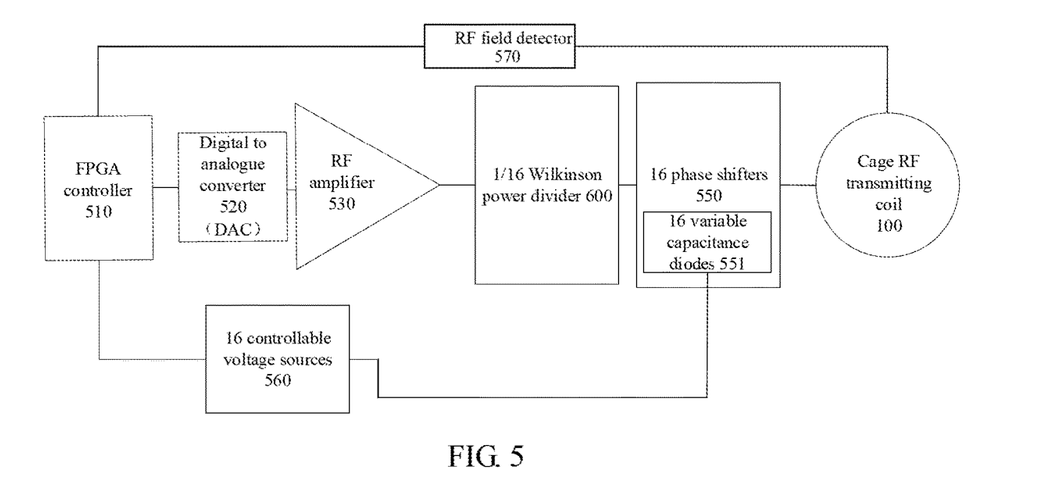
FIG. 5 is a schematic diagram illustrating a structure of a drive circuit of a RF transmitting coil according to a further example of the present disclosure.

FIG. 5 is a diagram illustrating a structure of a drive circuit of a RF transmitting coil according to still another example of the present disclosure. As shown in FIG. 5, the drive circuit may include an FPGA controller 510, a DAC 520, a RF amplifier 530, a 1/16 Wilkinson power divider 600, 16 phase shifters 550 and the cage RF transmitting coil 100 shown in FIG. 1. The cage RF transmitting coil 100 may include 16 feed ports 103, and the power divider 600 may include 16 output ports respectively coupled with 16 phase shifters 550.

In some cases, power of the amplified analogue drive signal received by the power divider 600 is high, and a solution with traditional microstrip lines may be not suitable for this case. In the present disclosure, the power divider 600 may include a plurality of waveguides to generate N signals from the amplified analogue drive signal. The N signals can have equal power.

For example, when the power divider 600 includes 16 output ports, the power divider 600 may be configured to generate the 16 signals from the amplified analogue drive signal and the 16 signals have equal power.

Figure 6:
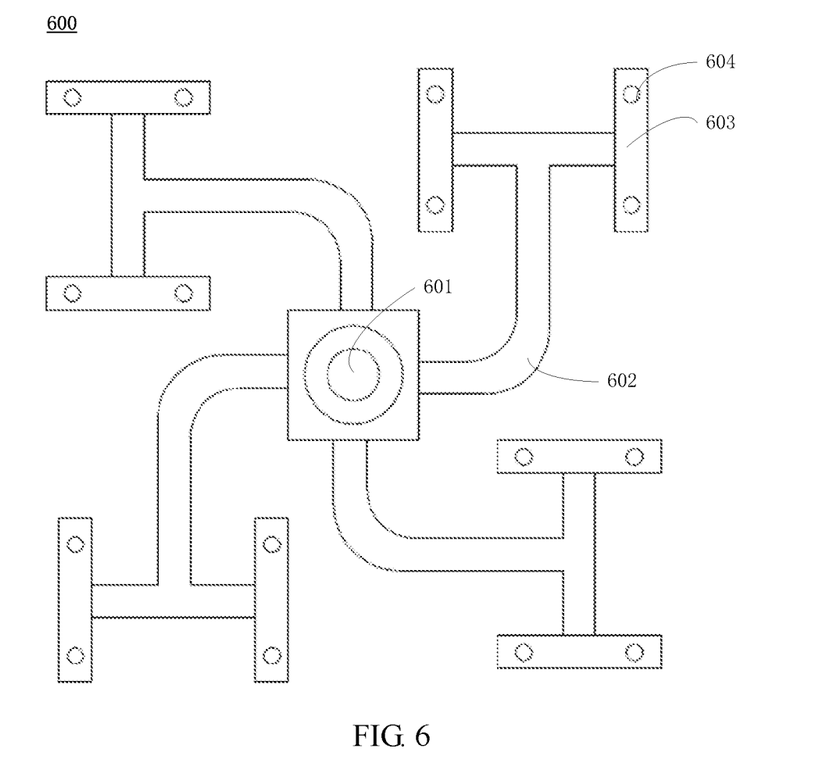
FIG. 6 is a schematic diagram illustrating a structure block diagram of a power divider according to an example of the present disclosure.

FIG. 6 is a schematic diagram illustrating a structure of the power divider 600 shown in FIG. 5. For illustration only in FIG. 6, the power divider 600 includes four first waveguides 602 in a central symmetry and eight second waveguides 603, where each of the first waveguides 602 has an inlet end serving as an input port 601 of the power divider and two outlet ends, and the eight second waveguides 603 are respectively coupled with one of the two outlet ends of one of the first waveguides 602. Where, two of the second waveguides 603 coupled with the two outlet ends of the same first waveguide 602 are symmetric and each of the second waveguides 603 has two outlets ends serving as the output ports 604 of the power divider 600.

In an example, four first waveguides 602 are of the same size and shape. The inlet end of the respective first waveguides 602 is coupled with the input port 601 of the power divider 600, and the four first waveguides 602 are centrally symmetrical relative to the input port 601 of the power divider 600.

As shown in FIG. 6, eight second waveguides 603 can be of the same size and shape. The eight second waveguides 603 are respectively coupled with one of the two outlet ends of one of the first waveguides 602. Two of the second waveguides 603 coupled with the two outlet ends of the same first waveguide 602 are symmetric. Two of the output ports 604 of the power divider 600 on the outlets ends of the same second waveguide 603 are symmetric.

In an example, combined with FIG. 5 and FIG. 1, through transmission of the four first waveguides 602 coupled with the input port 601 of the power divider 600, 4 first signals may be generated form the amplified analogue drive signal. Each of the first signals may be further transmitted by the second waveguide 603 to generate 4 second signals. In this way, 16 second signals are finally generated and then correspondingly input to the 16 feed ports 103 of the cage RF transmitting coil 100, so as to drive the coil legs 101 to generate a uniform RF field.

In an example, the input port 601 of the power divider 600 is of a square shape, and the first waveguides 602 are respectively coupled with central positions of four sides of the square-shaped input port.

Referring to FIG. 6, each of the first waveguides 602 may include a first connecting part and a second connecting part. An inlet end of the first connecting part may serve as the input port of the power divider. The inlet end of the first connecting part may be vertically coupled with the input port 601 of the power divider 600. A central position of the second connecting part is vertically coupled to an outlet end of the first connecting part. Two outlet ends of the second connecting part are both vertically coupled to a central position of the corresponding second waveguide 603. The first connecting part is in communication with the second connecting part. Two output ports of the power divider 600 on each of the second waveguides 603 are arranged symmetrically with respect to the central position of the corresponding second waveguide 603.

In the power divider 600 shown in FIG. 6, transmission lines from the output port 604 of the power divider 600 on each of the second waveguides 603 to the input port 601 of the power divider 600 are equal in length, so that the 16 signals generated from the amplified analogue drive signal have equal power. Thus, the cage RF transmitting coil 100 may generate a relatively uniform RF field.

In an example, the first waveguide 602 may be of a T shape. A top of the T shape may be the second connecting part, and a bottom of the T shape may be the first connecting part.

In an example, a bend may be arranged at the middle of the first connecting part to facilitate arrangement.

Figure 7:
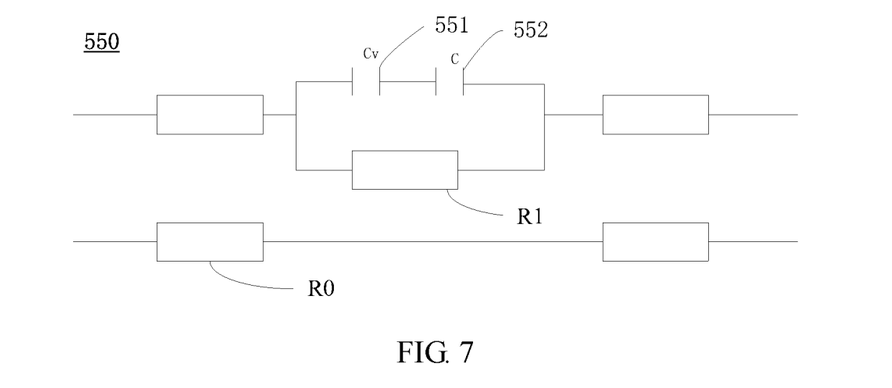
FIG. 7 is a schematic diagram illustrating a structure of an equivalent circuit of a phase shifter according to an example of the present disclosure.

FIG. 7 is a schematic diagram illustrating a structure of an equivalent circuit of one of the phase shifters 550 shown in FIG. 5. Referring to FIG. 5 and FIG. 7, each of the phase shifters 550 may include a variable capacitance diode 551 (its capacitance value is expressed as Cv), a capacitor 552 (its capacitance value is expressed as C), a resistor R1 and a wire resistor R0. The impedance Z0 of the wire resistor R0 is 50 Ohm. The admittance Y0 of the wire resistor R0 is $$\frac{1}{Z0} = \frac{1}{50} S \text{ (unit Siemens)}.$$

A phase shift amount of each of the phase shifters 550 is related to the capacitance value of the variable capacitance diode 551 of the phase shifter 550. The variable capacitance diode 551 of each of the phase shifters 550 may be coupled with a controllable voltage source 560 (as illustrated in FIG. 5). The capacitance value of the variable capacitance diode 551 coupled with the controllable voltage source 560 may be adjusted by changing the voltage of the controllable voltage source 560, so as to change the phase shift amount of each of the phase shifters 550.

As shown in FIG. 7, one of the output ports 604 of the power divider 600 is coupled with the variable capacitance diode 551 of the phase shifter 550. The variable capacitance diode 551 may be coupled in series with the capacitor 552. The resistor R1 is coupled with the variable capacitance diode 551 as well as the capacitor 552 in parallel. Since wires at an input end and an output of the equivalent circuit of each of the phase shifters 550 have resistance loss, the resistance loss of the wires may be equivalent to the resistor R0.

In the equivalent circuit of each of the phase shifters 550, the variable capacitance diode 551 is coupled in series with the capacitor 552, and a total impedance of the variable capacitance diode 551 and the capacitor 552 in series is $$\frac{1}{j\omega(Cv + C)},$$

where $\omega$ is an angular velocity, $\omega=2\pi f$, f is a frequency of an signal flowing through the variable capacitance diode 551 and the capacitor 552, and j is an imaginary unit. In this way, a total admittance of the variable capacitance diode 551 and the capacitor 552 in series may be $j\omega(C_v+C)$, the admittance of the resistor R1 is B, and the admittances of the wires of the equivalent circuit are cancelled out. Therefore, the admittance of the equivalent circuit is the sum of the admittance of the resistor R1 and the total admittance of the variable capacitance diode 551 and the capacitor 552 in series.

Therefore, the admittance Y (unit: S, i.e., Siemens) of the equivalent circuit of each of the phase shifters 550 may be obtained by the formula (1):

$$Y=B+j\omega(C_v+C) \tag{1}$$

In the formula (1), B is the admittance of the resistor R1, $C_v$ is a real-time capacitance value of the variable capacitance diode 551, and C is the capacitance value of the capacitor 552 which is coupled with the variable capacitance diode 551 in series.

The phase shift amount S of each of the phase shifters 550 is calculated by the formula (2):

$$S = \frac{2}{2 + (Y_0/Y)}. \tag{2}$$

In the formula (2), $Y_0$ is a characteristic admittance of the resistor R0.

According to the formula (1) and formula (2), the phase shift amount S of each of the phase shifters 550 may be calculated by the formula (3):

$$S = \frac{2}{2 + \frac{Y_0}{B + j\omega(C_V + C)}}. \tag{3}$$

It can be seen from the formula (3) that the phase shift amount S of each of the phase shifters 550 may be adjusted by changing the capacitance value of the variable capacitance diode 551 of the corresponding phase shifter.

Referring to FIG. 5, the capacitance value of the variable capacitance diode 551 coupled with the controllable voltage source 560 may be changed by controlling the voltage of the controllable voltage source 560, so as to adjust the phase shift amount of the corresponding phase shifter 550. Each of the controllable voltage sources 560 is coupled with the FPGA controller 510, and the voltage of each of the controllable voltage sources 560 is controlled by the FPGA controller 510.

In an example, the drive circuit may further include a RF field detector 570 coupled with the FPGA controller 510. The RF field detector may be configured to detect the RF field intensities on a plurality of positions (for example, near each coil leg 101) of the cage RF transmitting coil 100, and send the RF field intensities on the plurality of positions to the FPGA controller 510. The FPGA controller 510 may be further configured to adjust the voltage of the controllable voltage source 560 according to the RF field intensities on the plurality of positions. Phase of the signal input to each of the feed ports may be dynamically adjusted by changing the voltage of the corresponding controllable voltage source 560, so that the size of the RF field is changed, and the cage RF transmitting coil 100 can generate a relatively uniform RF field.

In an example, the FPGA controller 510 may be further configured to convert the RF field intensity on each of the plurality of positions which are sent by the RF detector into a voltage value, and adjust the voltage of each of the controllable voltage sources 560 according to the voltage value.

Figure 8:
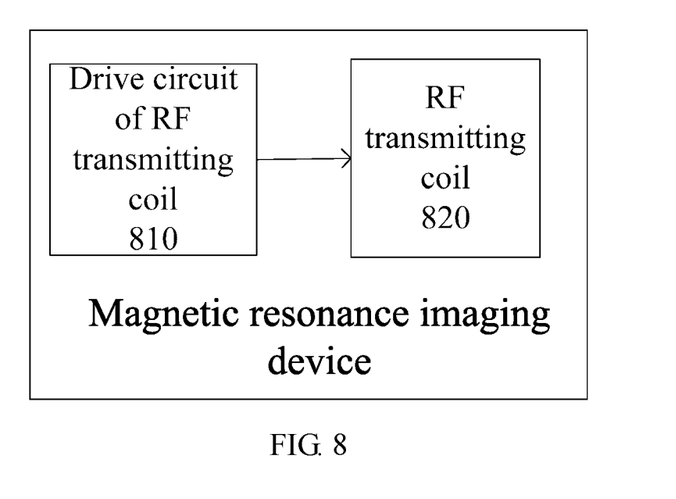
FIG. 8 is a schematic diagram illustrating a structure of an MRI device according to an example of the present disclosure.

FIG. 8 is a schematic diagram illustrating a magnetic resonance imaging device according to an example of the present disclosure. The magnetic resonance imaging device may include the above RF transmitting coil 820 and the above drive circuit of the RF transmitting coil 810.

As shown in FIG. 5, dynamic adjustment of the characteristics of the signal input to each of the feed ports of the RF transmitting coil 100 may be achieved by setting the power divider 600 and the phase shifter 550. RF transmitting links may be dynamically increased by increasing output ports 604 of the power divider 600. In this way, the number of feed ports 103 of the RF transmitting coil 100 may be increased so as to control the uniformity of the RF field generated by the RF transmitting coil 100. Further, the number of the RF amplifiers 530 also can be decreased, thereby improving the power amplifying efficiency and lowering the cost.

After considering the specification and practicing the present disclosure, the persons of skill in the prior art may easily conceive of other implementations of the present disclosure. The present disclosure is intended to include any variations, uses and adaptive changes of the present disclosure. These variations, uses and adaptive changes follow the general principle of the present disclosure and include common knowledge or conventional technical means in the prior art not disclosed in the present disclosure. The specification and examples herein are intended to be illustrative only and the real scope and spirit of the present disclosure are indicated by the claims of the present disclosure.

It should be understood that the present disclosure is not limited to the precise structure described above and shown in the drawings, and different modifications and changes may be made without departing from the scope of the present disclosure. The scope of the present disclosure is only limited by the claims attached.

What is claimed is:

1. A drive circuit of a radio-frequency (RF) transmitting coil, the drive circuit comprising:
   a controller configured to output a drive signal;
   a digital to analogue converter (DAC) coupled with the controller and configured to perform D/A conversion for the drive signal to output an analogue drive signal;
   a RF amplifier coupled with the DAC and configured to amplify the analogue drive signal to obtain an amplified analogue drive signal;
   a power divider coupled with the RF amplifier and comprising a plurality of waveguides configured to generate at least three signals based on the amplified analogue drive signal, the at least three signals having an equal power, wherein the power divider has at least three output ports each configured to output a respective signal of the at least three signals; and
   a plurality of phase shifters coupled with the power divider, each of the phase shifters being coupled with a respective output port of the at least three output ports and configured to adjust a phase of the respective signal output by the respective output port to obtain a phase adjusted signal, wherein the phase shifters are configured to output the phase adjusted signals to respective feed ports of the RF transmitting coil,
   wherein the power divider comprises:
   a plurality of first waveguides in a central symmetry relative to an input port of the power divider, wherein each of the first waveguides has an inlet end coupled to the input port of the power divider and two outlet ends, the inlet end of each of the plurality of first waveguides being coupled to a different corresponding side of the input port of the power divider; and
   a plurality of second waveguides, wherein each of the second waveguides is respectively coupled with one of the two outlet ends of one of the first waveguides, and wherein two of the second waveguides coupled with the two outlet ends of the same first waveguide are symmetric and each of the second waveguides has two outlet ends serving as the output ports of the power divider.

2. The drive circuit of claim 1, wherein the RF transmitting coil comprises a cage RF transmitting coil, and wherein the respective feed ports coupled with the phase shifters are arranged along a circumferential direction of the RF transmitting coil in an equal interval.

3. The drive circuit of claim 2, wherein a number of the output ports of the power divider and a number of the phase shifters are both equal to a number of the feed ports of the RF transmitting coil.

4. The drive circuit of claim 1, wherein each of the first waveguides comprises:
   a first connecting part of which an inlet end is coupled to the input port of the power divider; and
   a second connecting part of which a central position is coupled to an outlet end of the first connecting part and two outlet ends are both coupled to a central position of the corresponding second waveguide, wherein the first connecting part is in communication with the second connecting part.

5. The drive circuit of claim 4, wherein the first waveguide is substantially of a T shape, and a top of the T shape is used as the second connecting part and a bottom of the T shape is used as the first connecting part.

6. The drive circuit of claim 5, wherein the bottom of the T shape is substantially of a L shape, the L shape comprises a horizontal part and a vertical part perpendicular to the horizontal part, the horizontal part of which an inlet end is coupled to the input port of the power divider, and the vertical part is coupled to the central position of the corresponding second connecting part.

7. The drive circuit of claim 1, wherein two output ports of the power divider on each of the second waveguides are arranged symmetrically with respect to a central position of the corresponding second waveguide.

8. The drive circuit of claim 1, wherein each of the phase shifters comprises a variable capacitance diode coupled with a controllable voltage source.

9. The drive circuit of claim 8, wherein the controllable voltage source is coupled with the controller, and
wherein a voltage of the controllable voltage source is controllable by the controller.

10. The drive circuit of claim 9, further comprising a RF field detector,
wherein the RF field detector is configured to detect RF field intensities on a plurality of positions of the RF transmitting coil and send the RF field intensities to the controller, and
wherein the controller is configured to adjust the voltage of the controllable voltage source based on the RF field intensities on the plurality of positions.

11. A magnetic resonance imaging (MRI) device, comprising:
a RF transmitting coil; and
a drive circuit for the RF transmitting coil, the drive circuit comprising:
a controller configured to output a drive signal;
a digital to analogue converter (DAC) coupled with the controller and configured to perform D/A conversion for the drive signal to output an analogue drive signal;
a RF amplifier coupled with the DAC and configured to amplify the analogue drive signal to obtain an amplified analogue drive signal;
a power divider coupled with the RF amplifier and comprising a plurality of waveguides configured to generate at least three signals from the amplified analogue drive signal, the at least three signals having an equal power, wherein the power divider comprises at least three output ports each configured to output the at least three signals respectively; and
a plurality of phase shifters coupled with the power divider, wherein each of the phase shifters is coupled with a respective output port of the at least three output ports and configured to:
adjust a phase of the respective signal output by the respective output port to obtain a phase adjusted signal, and
output the phase adjusted signal to a respective feed port of the RF transmitting coil,
wherein the power divider comprises:
a plurality of first waveguides in a central symmetry relative to an input port of the power divider, wherein each of the first waveguides has an inlet end coupled to the input port of the power divider and two outlet ends, the inlet end of each of the plurality of first waveguides being coupled to a different corresponding side of the input port of the power divider; and
a plurality of second waveguides, wherein each of the second waveguides is respectively coupled with one of the two outlet ends of one of the first waveguides, and wherein two of the second waveguides coupled with the two outlet ends of the same first waveguide are symmetric and each of the second waveguides has two outlet ends serving as the output ports of the power divider.

12. The MRI device of claim 11, wherein the RF transmitting coil comprises a cage RF transmitting coil, and
wherein the respective feed ports coupled with the phase shifters are arranged along a circumferential direction of the RF transmitting coil in an equal interval.

13. The MRI device of claim 12, wherein a number of the output ports of the power divider and a number of the phase shifters are both equal to a number of the feed ports of the RF transmitting coil.

14. The MRI device of claim 11, wherein each of the first waveguides comprises:
a first connecting part of which an inlet end is coupled to the input port of the power divider; and
a second connecting part of which a central position is coupled to an outlet end of the first connecting part and two outlet ends are both coupled to a central position of the corresponding second waveguide, wherein the first connecting part is in communication with the second connecting part.

15. The MRI device of claim 14, wherein the first waveguide is substantially of a T shape, and a top of the T shape is used as the second connecting part and a bottom of the T shape is used as the first connecting part.

16. The MRI device of claim 15, wherein the bottom of the T shape is substantially of a L shape, the L shape comprises a horizontal part and a vertical part perpendicular to the horizontal part, the horizontal part of which an inlet end is coupled to the input port of the power divider, and the vertical part is coupled to the central position of the corresponding second connecting part.

17. The MRI device of claim 11, wherein two output ports of the power divider on each of the second waveguides are arranged symmetrically with respect to a central position of the corresponding second waveguide.

18. The MRI device of claim 11, wherein each of the phase shifters comprises a variable capacitance diode coupled with a controllable voltage source.

19. The MRI device of claim 18, wherein the controllable voltage source is coupled with the controller, and
wherein a voltage of the controllable voltage source is controllable by the controller.

20. The MRI device of claim 19, further comprising a RF field detector,
wherein the RF field detector is configured to detect RF field intensities on a plurality of positions of the RF transmitting coil and send the RF field intensities to the controller, and
wherein the controller is configured to adjust the voltage of the controllable voltage source based on the RF field intensities on the plurality of positions.

* * * * *